United States Patent
Ivanov et al.

(10) Patent No.: US 7,872,244 B2
(45) Date of Patent: Jan. 18, 2011

(54) LITHOGRAPHIC APPARATUS AND DEVICE MANUFACTURING METHOD

(75) Inventors: Vladimir Vitalevich Ivanov, Moscow (RU); Vadim Yevgenyevich Banine, Helmond (NL); Arno Jan Bleeker, Westerhoven (NL); Konstantin Nikolaevich Koshelev, Troitsk (RU); Pavel Stanislavovich Antsiferov, Troitsk (RU); Vladimir Mihailovitch Krivtsun, Troitsk (RU); Dmitriy Victorovich Lopaev, Tekstilchik (RU)

(73) Assignee: ASML Netherlands B.V., Veldhoven (NL)

( * ) Notice: Subject to any disclaimer, the term of this patent is extended or adjusted under 35 U.S.C. 154(b) by 749 days.

(21) Appl. No.: 11/889,065

(22) Filed: Aug. 8, 2007

(65) Prior Publication Data

US 2009/0040492 A1    Feb. 12, 2009

(51) Int. Cl.
*A61N 5/00* (2006.01)
*G01N 21/64* (2006.01)

(52) U.S. Cl. ............... 250/461.1; 250/504 R; 315/111.21; 376/144; 378/34

(58) Field of Classification Search ............ 250/461.1, 250/493.1, 504 R; 315/111.21, 111.71; 376/144, 145; 378/34, 119, 140
See application file for complete search history.

(56) References Cited

U.S. PATENT DOCUMENTS

| | | | | |
|---|---|---|---|---|
| 4,589,123 A * | 5/1986 | Pearlman et al. | ............ | 378/106 |
| 4,635,282 A | 1/1987 | Okada et al. | | |
| 4,837,794 A * | 6/1989 | Riordan et al. | ............. | 378/119 |
| 5,296,891 A | 3/1994 | Vogt et al. | ............ | 355/67 |
| 5,523,193 A | 6/1996 | Nelson | ........................ | 430/311 |
| 6,075,838 A * | 6/2000 | McGeoch | .................... | 378/119 |
| 6,232,613 B1 | 5/2001 | Silfvast et al. | ............... | 250/504 |
| 6,408,052 B1 * | 6/2002 | McGeoch | .................... | 378/119 |
| 6,452,199 B1 * | 9/2002 | Partlo et al. | ............. | 250/504 R |
| 6,566,667 B1 * | 5/2003 | Partlo et al. | ............. | 250/504 R |
| 7,075,096 B2 * | 7/2006 | McGeoch | ............... | 250/504 R |
| 7,135,692 B2 * | 11/2006 | Ivanov et al. | ............ | 250/492.2 |
| 7,397,190 B2 * | 7/2008 | Derra et al. | .................. | 313/618 |

(Continued)

FOREIGN PATENT DOCUMENTS

WO    WO 98/33096    7/1998

(Continued)

OTHER PUBLICATIONS

Eberle J et al: "Plasma focus. A new X-ray source for X-ray microscopy and X-ray lithography" Physikalische Blaetter West Germany, vol. 45, No.8, Aug. 1989, pp. 333-339, XP001536870 ISSN: 0031-9279.

(Continued)

*Primary Examiner*—Bernard E Souw
(74) *Attorney, Agent, or Firm*—Pillsbury Winthrop Shaw Pittman LLP

(57) ABSTRACT

A source configured to generate radiation for a lithographic apparatus is disclosed. The source includes an anode, and a cathode. The cathode and the anode are configured to create a discharge in a fuel in a discharge space between the anode and the cathode so as to generate a plasma, the cathode and the anode positioned relative to each other so that, in use, current lines extending between the anode and the cathode are substantially curved so as to create a force that substantially radially compresses the plasma only in a region proximate an upper surface of the cathode or of the anode.

36 Claims, 12 Drawing Sheets

U.S. PATENT DOCUMENTS

| | | | |
|---|---|---|---|
| 7,488,962 B2 * | 2/2009 | Korobochko et al. | 250/504 R |
| 7,518,134 B2 * | 4/2009 | Ivanov et al. | 250/504 R |
| 2002/0009176 A1 | 1/2002 | Amemiya et al. | |
| 2002/0020356 A1 * | 2/2002 | Murakami | 118/723 EB |
| 2002/0074226 A1 * | 6/2002 | Murakami et al. | 204/298.41 |
| 2002/0100882 A1 * | 8/2002 | Partlo et al. | 250/504 R |
| 2002/0157609 A1 * | 10/2002 | Miyake | 118/723 VE |
| 2003/0104142 A1 * | 6/2003 | Murakami et al. | 427/598 |
| 2004/0045812 A1 * | 3/2004 | Miyake | 204/192.38 |
| 2004/0108473 A1 * | 6/2004 | Melnychuk et al. | 250/504 R |
| 2004/0141165 A1 * | 7/2004 | Zukavishvili et al. | 355/53 |
| 2006/0273732 A1 * | 12/2006 | Korobochko et al. | 315/111.21 |
| 2007/0069159 A1 | 3/2007 | Banine et al. | 250/493.1 |
| 2009/0040491 A1 * | 2/2009 | Ivanov et al. | 355/67 |

FOREIGN PATENT DOCUMENTS

| | | |
|---|---|---|
| WO | WO 98/38597 A2 | 9/1998 |
| WO | WO 98/38597 A3 | 9/1998 |
| WO | 2005/060321 A | 6/2005 |

OTHER PUBLICATIONS

International Search Report and Written Opinion issued on Oct. 31, 2008 in International Application No. PCT/EP2008/006188.

* cited by examiner

LITHOGRAPHIC APPARATUS AND DEVICE MANUFACTURING METHOD

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature.

It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to significantly shorten the exposure wavelength and, thus, reduce the minimum printable pitch, it has been proposed to use an extreme ultraviolet (EUV) radiation source. In contrast to conventional ultraviolet radiation sources, which are configured to output a radiation wavelength greater than or equal to about 157 nm, EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

SUMMARY

The power radiated by an EUV radiation source depends on the source size. Generally, it is desirable to collect as much power radiated by the source as possible because a large collection efficiency of the radiated power means that the power provided to the source can be reduced, which will be beneficial to the lifetime of the source. The source size together with the collection angle form the etendue of the source. Only radiation emitted within the etendue of the source may be taken into account and used for illuminating the patterning device.

In an aspect of the invention, there is provided a source configured to generate radiation for a lithographic apparatus, the source comprising an anode; and a cathode, the cathode and the anode configured to create a discharge in a fuel in a discharge space between the anode and the cathode so as to generate a plasma, the cathode and the anode positioned relative to each other so that, in use, current lines extending between the anode and the cathode are substantially curved so as to create a force that substantially radially compresses the plasma only in a region proximate an upper surface of the cathode or of the anode.

In an aspect of the invention, there is provided a lithographic system comprising: a source configured to generate radiation for a lithographic apparatus, the source including an anode, and a cathode, the cathode and the anode configured to create a discharge in a fuel in a discharge space between the anode and the cathode so as to generate a plasma, the cathode and the anode positioned relative to each other so that, in use, current lines extending between the anode and the cathode are substantially curved so as to create a force that substantially radially compresses the plasma only in a region proximate an upper surface of the cathode or of the anode; a pattern support configured to hold a patterning device, the patterning device configured to pattern the radiation to form a patterned beam of radiation; a substrate support configured to support a substrate; and a projection system configured to project the patterned beam of radiation onto the substrate.

In an aspect of the invention, there is provided a method for generating radiation for use in a lithographic apparatus, the method comprising: supplying a fuel to a discharge space located between a cathode and an anode; creating a discharge between the cathode and the anode in the fuel to form a plasma that is adapted to emit the radiation; and positioning the cathode and the anode relative to each other so that, in use, current lines extending between the anode and the cathode are substantially curved so as to create a force that substantially radially compresses the plasma only in a region proximate an upper surface of the cathode or of the anode.

In an aspect of the invention, there is provided a device manufacturing method comprising: generating a beam of radiation, the generating including supplying a fuel to a discharge space located between a cathode and an anode, creating a discharge between the cathode and the anode in the fuel to form a plasma that is adapted to emit the radiation, and positioning the cathode and the anode relative to each other so that, in use, current lines extending between the anode and the cathode are substantially curved so as to create a force that substantially radially compresses the plasma only in a region proximate the upper surface of the anode or of the cathode; patterning the beam of radiation to form a patterned beam of radiation; and projecting the patterned beam of radiation onto a substrate.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
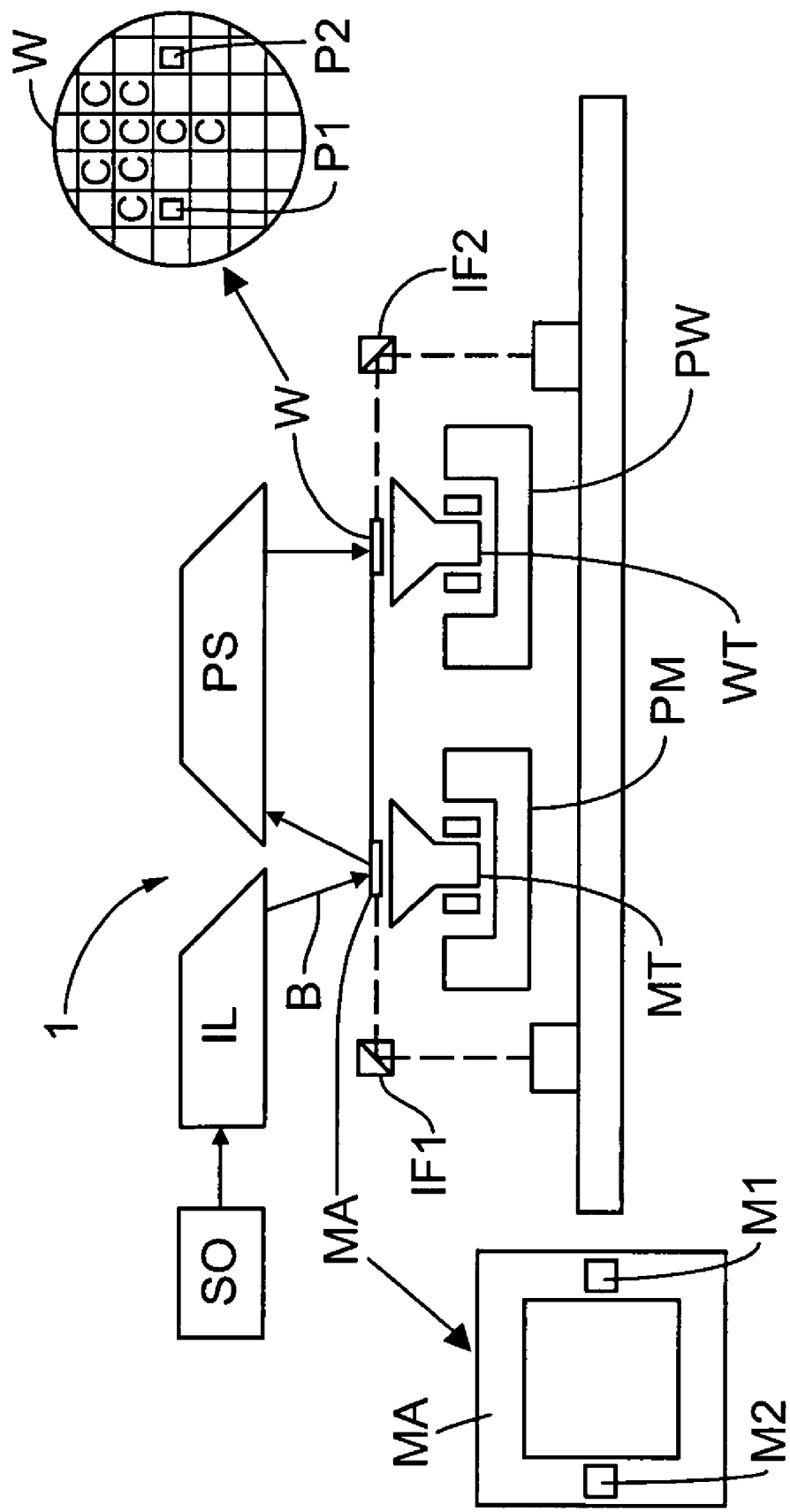
FIG. 1 schematically depicts a lithographic apparatus according to an embodiment of the present invention.

FIG. 1 schematically depicts a lithographic apparatus 1 according to an embodiment of the present invention. The apparatus 1 includes a source SO configured to generate radiation, an illumination system (illuminator) IL configured to condition a radiation beam B (e.g. EUV radiation) from the radiation received from source SO. The source SO may be provided as a separate unit. A support (e.g. a mask table) MT, which may also be referred to as a pattern support, is configured to hold a patterning device (e.g. a mask) MA and is connected to a first positioning device PM configured to accurately position the patterning device MA in accordance with certain parameters. A substrate table or substrate support (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support MT holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases, the source may be an integral part of the lithographic apparatus, for example when the source is a mercury lamp. The source SO and the illuminator IL, together with the beam delivery system (not shown in FIG. 1) if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser (not shown in FIG. 1). The illuminator may be used to condition the radiation beam, to have a desired uniformity and intensity distribution in its cross-section.

The radiation beam B is incident on the patterning device (e.g., mask) MA, which is held on the support (e.g., mask table) MT, and is patterned by the patterning device. After being reflected by the patterning device MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the patterning device MA with respect to the path of the radiation beam B, e.g. after mechanical retrieval from a mask library, or during a scan. In general, movement of the support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support MT and the substrate table WT are scanned synchronously while a pattern imparted to the radiation beam is projected onto a target portion C (i.e. a single dynamic exposure). The velocity and direction of the substrate table WT relative to the support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
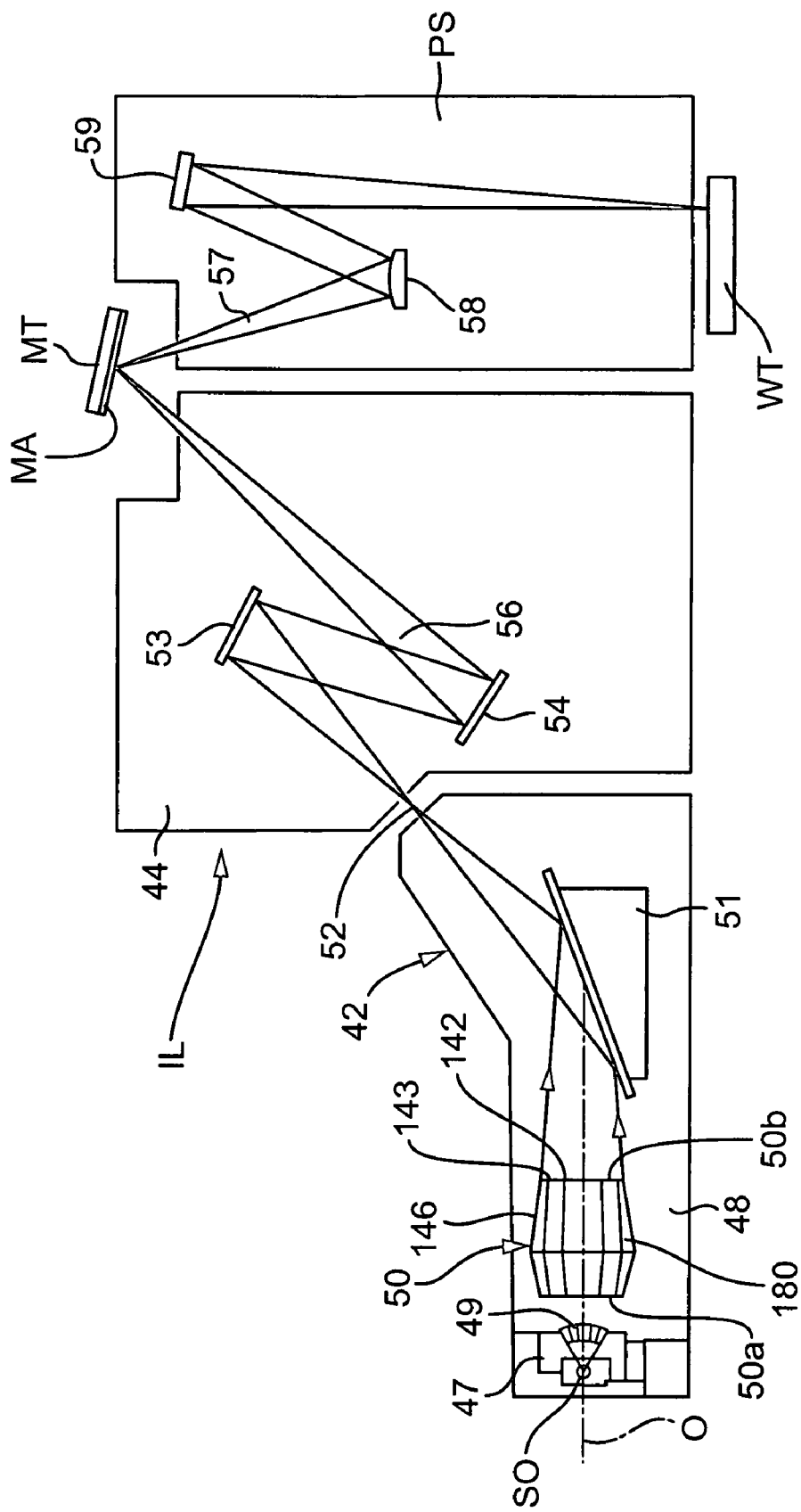
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The contaminant trap 49 may include a channel structure. Contaminant trap 49 may also include a gas barrier or a combination of a gas barrier and a channel structure. In an embodiment, as discussed in FIG. 3, a Sn source is applied as an EUV source.

The collector chamber 48 includes a radiation collector 50 which may be formed by a grazing incidence collector. Radiation collector 50 has an upstream radiation collector side 50a and a downstream radiation collector side 50b. The radiation collector 50 includes reflectors 142, 143 and outer reflector 146, as shown in FIG. 2. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto the patterning device MA positioned on the support MT. A patterned beam 57 is formed which is imaged in projection system PS via reflective elements 58, 59 onto substrate table WT. More elements than shown may generally be present in illumination optics unit 44 and projection system PS. Grating spectral filter 51 may optionally be present, depending upon the type of lithographic apparatus. Further, there may be more mirrors present than those shown in FIG. 2, for example there may be 1-4 more reflective elements present than reflective elements 58, 59.

It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O.

Instead of using a grazing incidence mirror as collector mirror 50, a normal incidence collector may be applied. Collector mirror 50, as described herein in an embodiment in more detail as nested collector with reflectors 142, 143, and 146, and as schematically depicted in, amongst others, FIG. 2, is herein further used as example of a collector (or collector mirror). Hence, where applicable, collector mirror 50 as grazing incidence collector may also be interpreted as collector in general and in a specific embodiment also as normal incidence collector.

Further, instead of a grating 51, as schematically depicted in FIG. 2, a transmissive optical filter may be applied. Optical filters transmissive for EUV and less transmissive for or even substantially absorbing UV radiation are known in the art. Hence, "grating spectral purity filter" is herein further indicated as "spectral purity filter," which includes gratings or transmissive filters. Not depicted in FIG. 2, but also included as optional optical element may be EUV transmissive optical filters, for instance arranged upstream of collector mirror 50, or optical EUV transmissive filters in illumination unit 44 and/or projection system PS.

As will be appreciated, the contaminant trap 49, and/or radiation collector 50 and/or the spectral purity filter 51 may be part of the illumination optics 44. Similarly, the reflective elements 53 and 54 may be part of the radiation system 42.

In the embodiment of the FIGS. 1 and 2, the lithographic apparatus 1 is a maskless apparatus in which the patterning device MA is a programmable mirror array. One example of such an array is a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT Publication Nos. WO 98/38597 and WO 98/33096. In the case of a programmable mirror array, the support structure may be embodied as a frame or table, for example, which may be fixed or movable as required.

The size(s) of the mirrors in a programmable mirror array is/are generally larger than the critical dimension of a pattern present on a conventional (reflective or transmissive) mask. As such, maskless lithographic apparatus generally requires a projection lens that has a higher de-multiplication factor than that of a non-maskless apparatus. For example, the de-multiplication factor of maskless lithographic apparatus is about 100, whereas the de-multiplication factor of non-maskless lithographic apparatus is about 4. Therefore, for a given numerical aperture of the projection system, the patterned radiation beam collected by the projection system PS in a maskless apparatus is much smaller than that of a lithographic apparatus using a conventional (reflective or transmissive) mask. This, in turn, limits the etendue of the maskless apparatus.

Existing EUV sources that are developed for conventional patterning device applications may have a source etendue that is significantly larger than that of a maskless lithographic apparatus. If the etendue of the source is larger than the etendue of the lithographic apparatus, radiation may be lost. As a result, the exposure time of each substrate may be longer. This may affect substrate throughput.

Due to the small etendue of a maskless apparatus, it is therefore desirable that all the radiations emitted by the radiation source SO be collected by the lithographic apparatus 1 to limit radiation loss. In order to ensure that substantially all the radiation emitted by the source SO illuminates the patterning device MA and is collected by the projection system PS, it is desirable to match the etendue of the source SO with that of the lithographic apparatus 1. For example, in the embodiments of FIGS. 1 and 2, it is desirable to limit the etendue of the source in a range lower than about 0.03 mm$^2$ steradian.

The effective axial size of the plasma influences the etendue of the source. In order to adjust (e.g. reduce) the etendue of the plasma source SO, thereby matching the etendue of the source with the etendue of the lithographic apparatus 1, the source SO is constructed and arranged such that the radial and/or axial size of the plasma is reduced during the discharge.

Figure 3A:
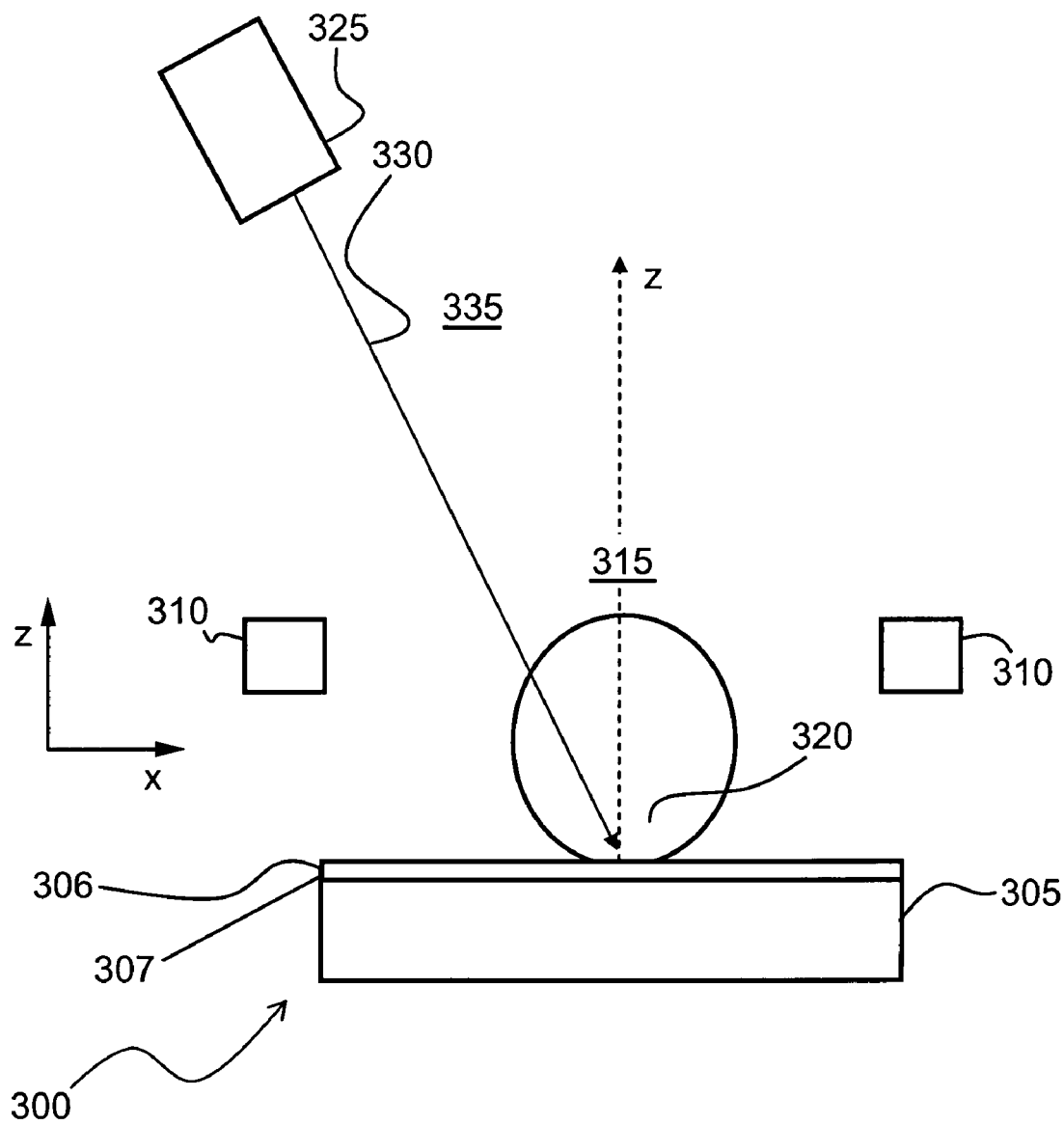
FIGS. 3a-b are a schematic representation of an EUV plasma source in accordance with an embodiment of the invention.
Figure 3B:
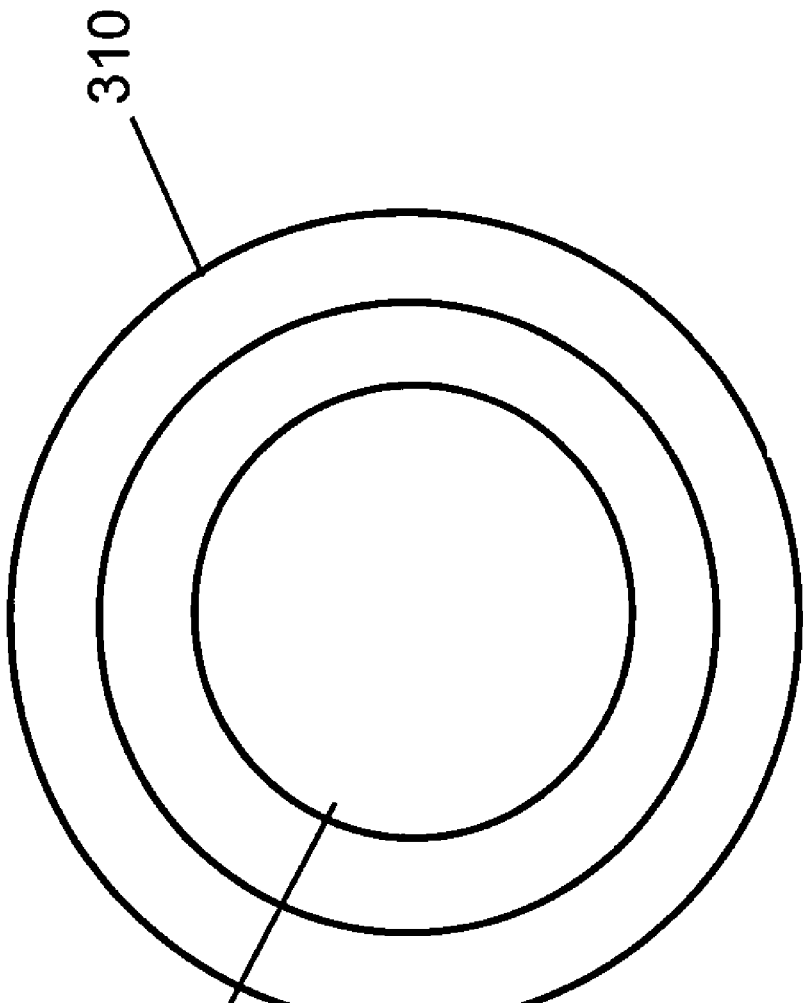
Figure 3B:
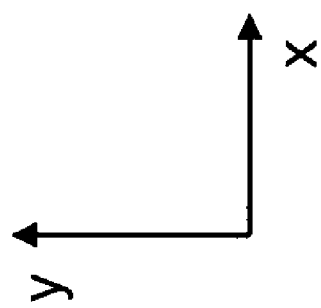

FIGS. 3*a-b* show a plasma source 300 for use in the lithographic apparatus of FIGS. 1 and 2 in accordance with an embodiment of the invention. FIG. 3*a* represents a schematic cross section view of the plasma source 300 in the x-z plane. FIG. 3*b* represents a schematic top view of the source 300 in the x-y plane. It will be appreciated that the plasma source 300 is not limited to the example depicted in FIGS. 3*a-b*. The plasma source SO may be constructed differently in other embodiments of the invention. For example, it will be appreciated that the plasma source may be non-axially symmetric in another embodiment of the invention.

As shown in FIGS. 3*a-b*, plasma source 300 includes a cathode 305, an anode 310 and a discharge space 315 located between the anode and the cathode. The cathode and anode 305, 310 each have a generally cylindrical shape that is substantially centered on a common z-axis. In FIG. 3*a*, the z-axis is referred to as the discharge axis. The anode 310 and cathode 305 are connected to a power source such that, in operation, a high voltage may be applied between the electrodes. As will be appreciated, the depicted positions of the cathode 305 and anode 310 may be reversed in this or other embodiments.

In operation, a high temperature discharge plasma is generated by applying a discharge in a working material, e.g. a fuel, between the cathode 305 and the anode 310. The working material or fuel being used to generate the plasma is located in the discharge space 315. Initially, the working material may be solid, liquid or gaseous. For example, in the implementation of FIGS. 3*a-b*, the working material (fuel) may consist of a thin layer of tin (Sn) 306 located on the upper surface 307 of the cathode 305. The upper surface 307 of the cathode 305 is substantially perpendicular to the z-axis. In an implementation, the working material may include a gas such as Xe. In an implementation, different materials such as lithium or indium may be used.

Ignition of the plasma discharge may be performed with a laser source 325. The radiation beam 330 outputted by the laser source 325 is focused onto the upper portion 307 of the cathode 305 through the opening 335. An optical system (not shown in FIG. 3a) may be used to focus the radiation beam 330 onto the upper surface 307. Due to the absorption of the laser energy in the thin layer 306, Sn is evaporated and partly ionized to form a plasma 320.

The plasma 320 expands during the discharge between the cathode 305 and the anode 310 and fills the volume defined by the fuel material between the cathode and the anode. Specifically, a few tens of nanoseconds after laser ablation, the fuel vapor expands and reaches the edge of the anode 310 forming a conducting path between the cathode 305 and the anode 310. The density of particles within the plasma 320 varies along the axial z-direction. Shortly after laser ablation, the particles within the plasma 320 are confined in a small region located proximate the cathode 305. As the fuel vapor expands, the concentration of particles within the plasma 320 decreases and the radius r (in the x-y plane) of the envelope that contains the plasma 320 increases. Generally, the radius r of the envelope that contains the plasma 320 increases substantially linearly as a function of the distance from the cathode in the z-direction.

Once the conducting path is formed, the discharge between the anode 310 and the cathode 305 is triggered, thereby causing further ionizations and heating within the plasma 320. After plasma ignition, the plasma 320 is sustained by ohmic heating in which further ionizations are created within the plasma. A magnetic field is generated by the current flowing between the anode 310 and the cathode 305. The magnetic field causes a Lorentz force F to act on the particles of the plasma 320. The magnetic pressure created by the magnetic field compresses the plasma 320 along the radial directions to form a plasma pinch elongated along the z-direction (pinch axis). This is called the pinch effect.

The magnetic compression of the plasma 320 continues until an equilibrium is reached at which the magnetic compression acting on the plasma is balanced by the thermal pressure within the plasma. As a result of this compression (i.e. pinch effect), a plasma column is created along the discharge axis (i.e. z-axis). The number of particles (atoms and ions) in a cross-section of the plasma column at a given distance from the irradiated electrode (i.e. cathode 305 in FIGS. 3a-b) corresponds to the initial fuel (working material) density integrated over the radius of the cross section of the plasma column. This density of particles within the plasma decreases as the distance from the cathode increases.

Further magnetic compression, i.e. size reduction of the plasma, may only occur locally by disrupting the equilibrium between the magnetic compression acting on the plasma and the thermal pressure within the plasma. Disruption of equilibrium leads to the development of a "neck" type of instability. In practice, disruption of the equilibrium may be produced either by an outflow of plasma from the neck or/and strong radiation emission from plasma. The plasma, which results from the neck instability, includes a plurality of plasma points or micropinches, which are able to radiate in the EUV spectral region at the initial stage of its development. The development of micropinches, which intensively radiate in the EUV range, may be possible for specific initial conditions formed in the primary plasma column. For example, one of these initial conditions may be met if the initial linear density of particles in the plasma lies within specific limits defined hereinafter as $N_{MIN}$ and $N_{MAX}$.

Figure 4A:
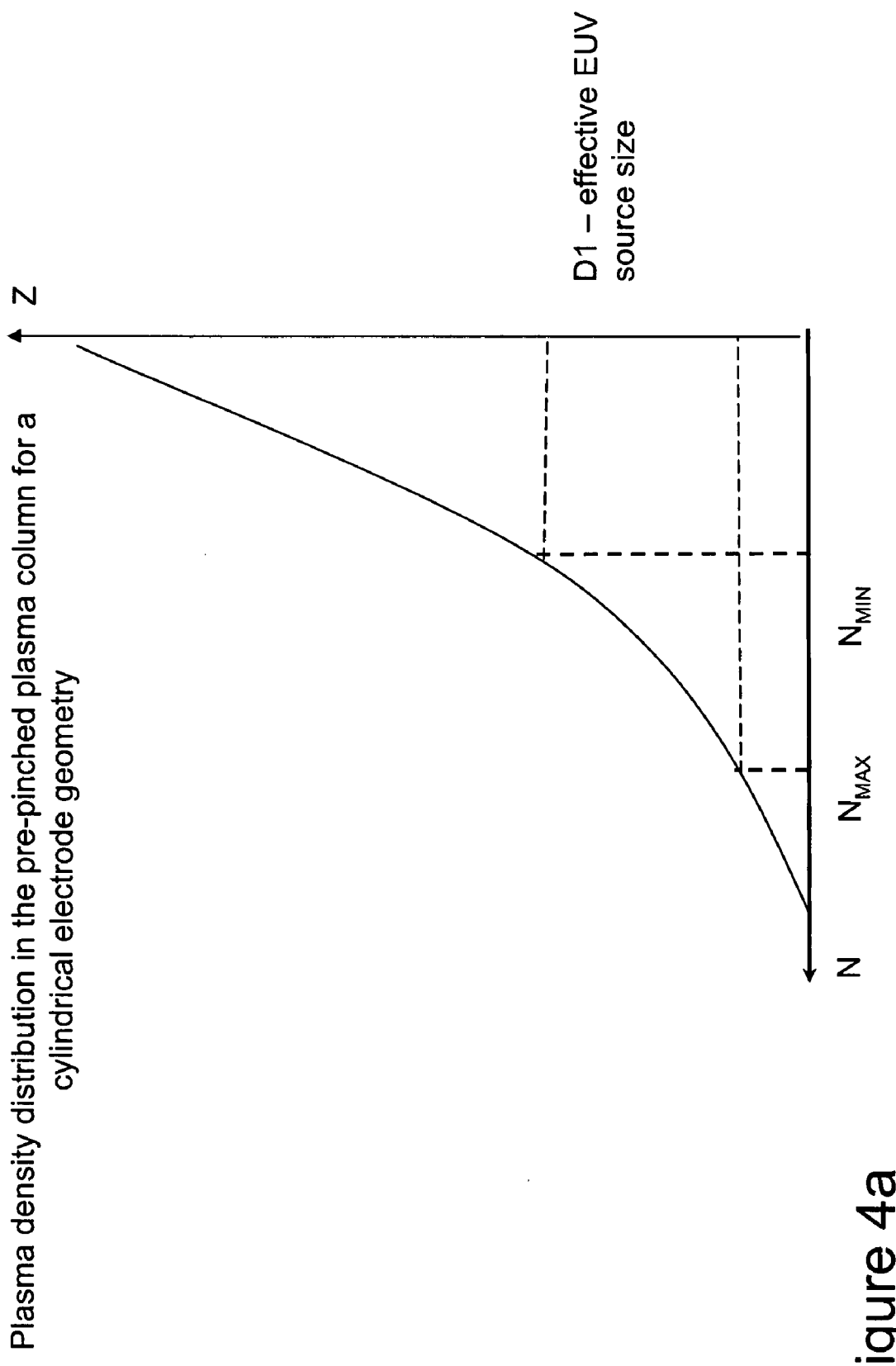
FIG. 4a schematically represents a distribution of density of particles within the plasma.

Referring now to FIG. 4a, this figure schematically shows the distribution of the density of particles within the plasma 320 during the discharge along the z-direction. As indicated previously, the EUV regime may only develop for a limited region (between $N_{MAX}$ and $N_{MIN}$) of particle density, which region is schematically represented in FIG. 4a. The corresponding length of this region of particle density along the discharge axis (z-axis) is denoted as D1. D1 corresponds to the length of the pinch in which the EUV radiating micropinches develop.

In effect, the pinch along D1 includes a plurality of elementary sources, or plasma points, spots or micropinches. It is only within this region defined by D1 that these micropinches may develop. The characteristics of these elementary sources may depend upon, for example, the fuel being used to create the plasma (Sn, Xe, . . . ), the geometry of the source (e.g., size of the cathode and anode, distance between the cathode and anode) and the power supplied to the source. The radial and axial sizes of these elementary sources are usually proportional to each other. For example, if the plasma fuel consists of tin (Sn), the radial and axial sizes of the EUV radiating points may be about 0.02 cm and 0.05 cm, respectively.

Figure 4B:
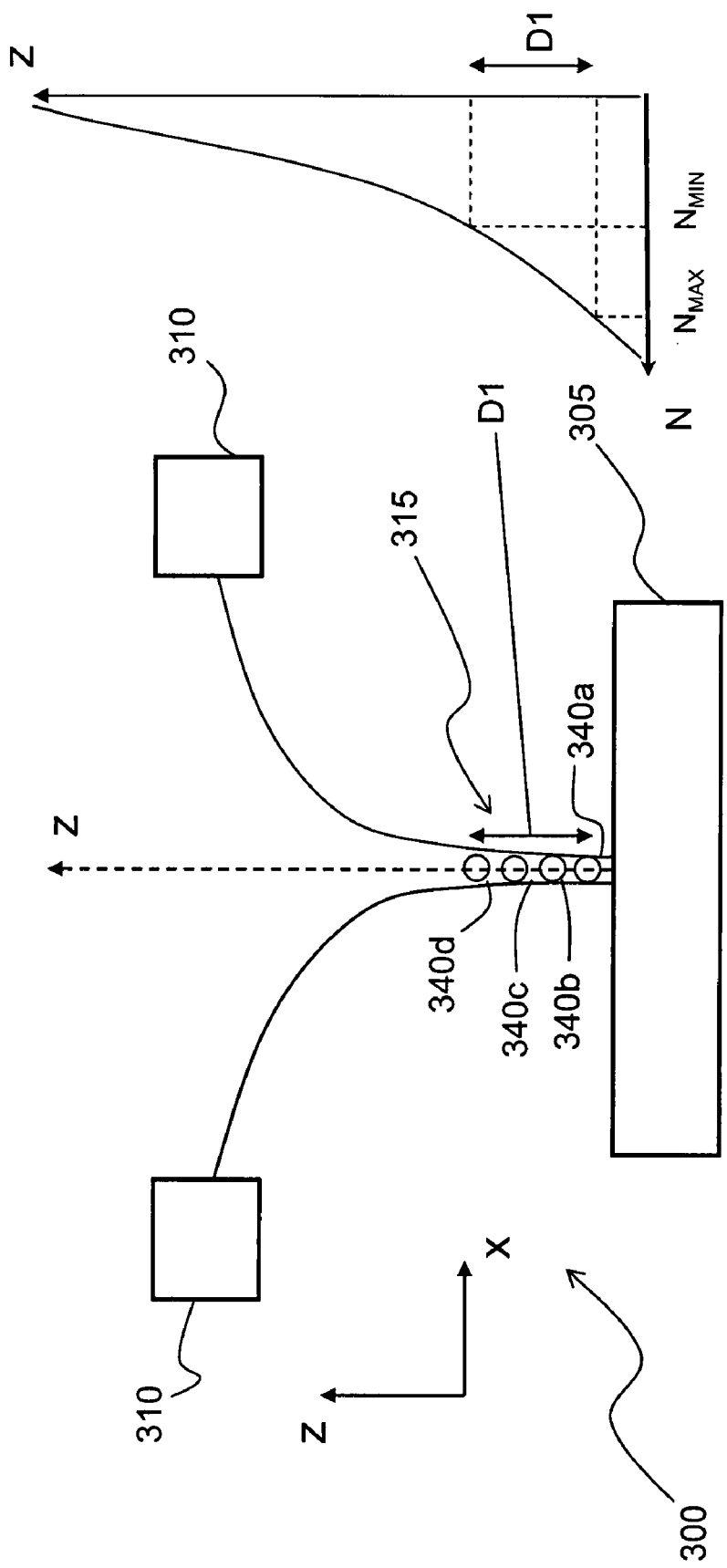
FIG. 4b schematically represents an EUV plasma source in accordance with an embodiment of the invention.

Referring to FIG. 4b, this figure shows a schematic representation of various elementary sources 340a-d that may develop over the distance D1 during the plasma discharge. FIG. 4b also shows the distribution of particle density represented in FIG. 4a. The collective effect of the plurality of elementary sources 340a-d over time determines the effective axial size of the source 300. The effective axial size of the source SO, in turn, influences the etendue of the source. The more the elementary sources, the higher the etendue.

Figure 4C:
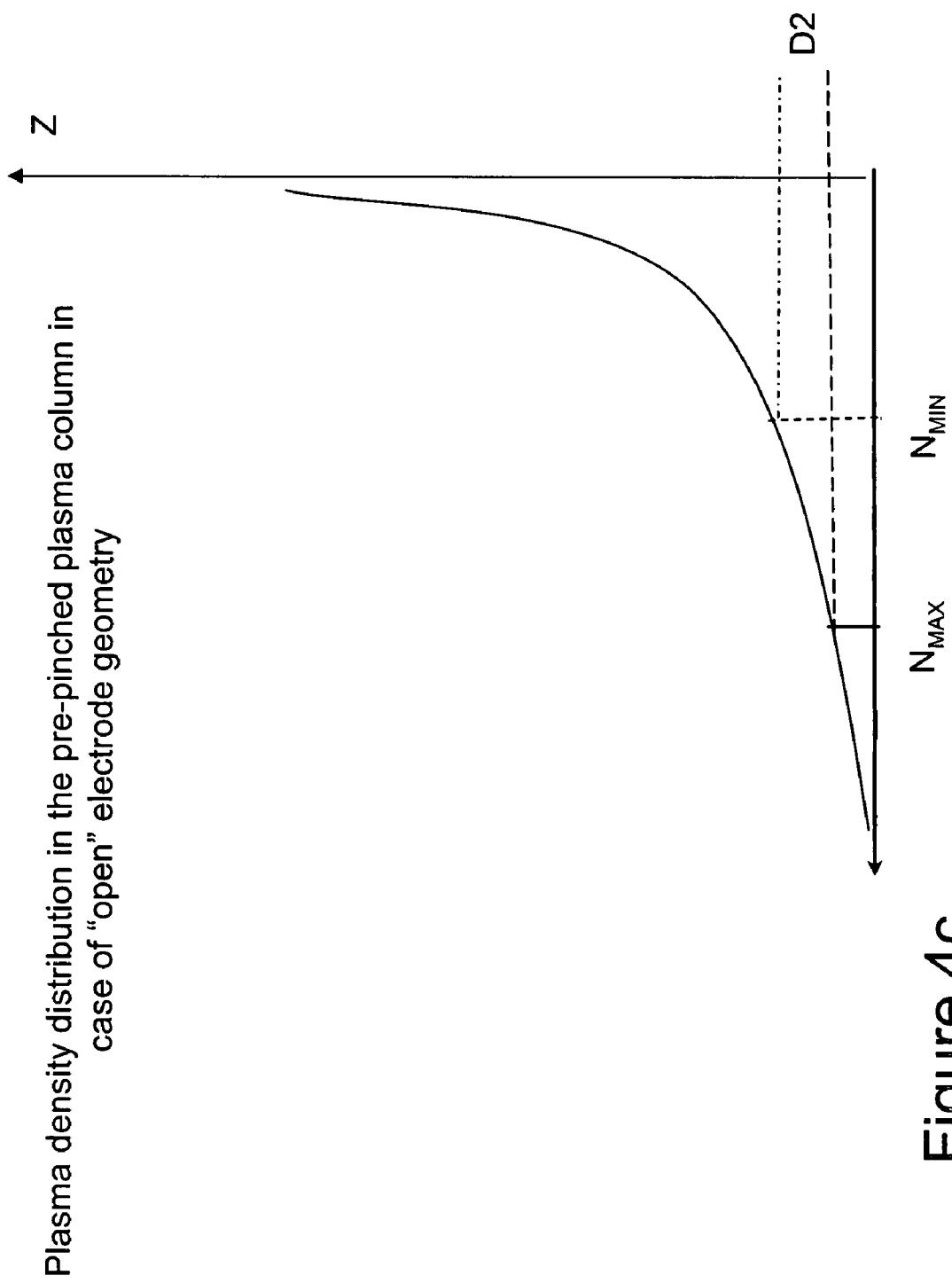
FIG. 4c schematically represents a distribution of density of particles within the plasma in accordance with an embodiment of the invention.

In order to match the etendue of the source 300 with that of the lithographic apparatus 1, the distribution of the density of particles within the plasma may be changed to a new distribution for which the length D of the pinch is reduced. For example, referring to FIG. 4c, change from the shallow distribution of FIG. 4a to the steep distribution of FIG. 4c may significantly reduce the length of the pinch along the axial z-direction. For a same particle density, the length of the pinch D2 is smaller than the length of the pinch D1.

Modification of the particle density within the plasma and, thus, reduction of the length of the pinch are performed in an embodiment of the invention by creating a strong gradient of initial plasma parameters.

Referring back to FIGS. 3a-b, the cathode 305 is positioned relative to the anode 310 such that strong gradients of plasma parameters in the plasma column occur after initial compression. These strong gradients of initial plasma parameters result from a strong curvature of the current lines flowing between the anode 310 and the cathode 305 at the time the discharge is initiated. With such conditions, current lines proximate the cathode 305 are directed along the discharge axis z, as in a conventional z pinch, and the magnetic pressure creates a force F that is directed along the plasma radius, thereby compressing the plasma toward the discharge axis. At some distance from the cathode 305, current lines have a strong curvature. This strong curvature of current lines causes additional expansion of the plasma along the axial direction, thus decreasing the number of particles in the pre-compressed plasma column outside the region proximate the surface of the cathode 305.

Figure 5:
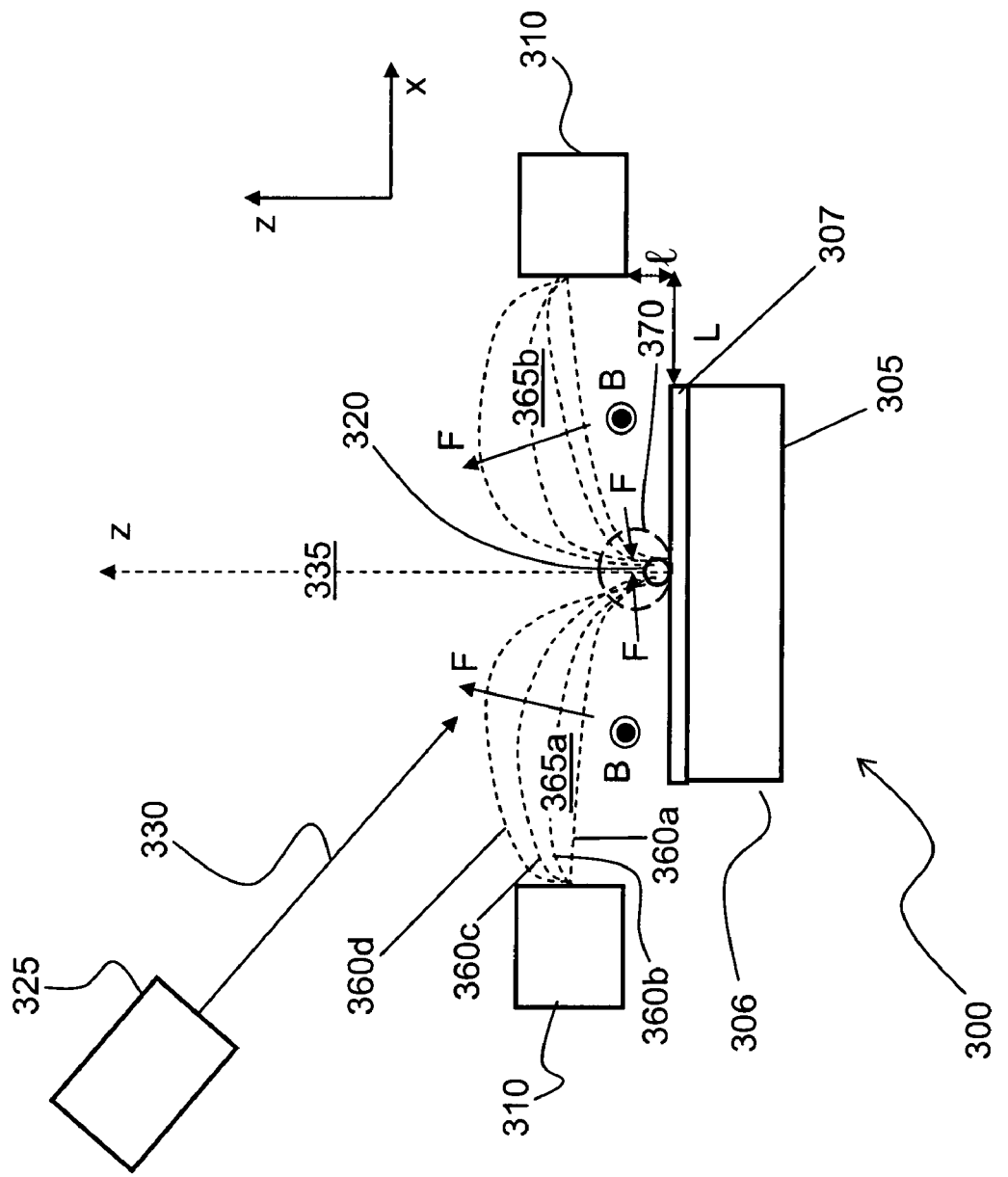
FIG. 5 schematically represents an EUV plasma source in accordance with an embodiment of the invention.

Referring now to FIG. 5, this figure schematically shows the expansion of the plasma 320 when the cathode 305 is positioned relative to the anode 310 in order to create a strong gradient of initial plasma parameters. Ignition of the plasma discharge is performed with the laser source 325. The radiation beam 330 outputted by the laser source 325 is focused onto the upper portion 307 of the cathode 305 through the opening 335. Due to the absorption of the laser energy in the thin layer 306, Sn is evaporated and partly ionized to form a plasma 320.

A few tens of nanoseconds after laser ablation, the fuel vapor expands and reaches the edge of the anode 310 forming a conducting path between the cathode 305 and the anode 310. Once the conducting path is formed, the discharge between the anode 310 and the cathode 305 is triggered, thereby causing further ionizations and heating within the plasma 320. FIG. 5 shows the current lines 360a-d that develop between the cathode 305 and the anode 310 during expansion of the fuel vapor. The current lines 360a-d create a magnetic field B and a Lorentz force F. As can be seen in FIG. 5, the current lines 360a-d are strongly directed to the left region 365a and the right region 365b of the source 300, thereby creating in these regions a Lorentz force F that is directed substantially along the axial z-direction. As a result, due to the strong curvature of the current lines 360a-d and the orientation of the Lorentz force F, compression of the plasma 320 may only occur in a very restricted area or region 370 proximate the cathode 305. In the area 370 proximate the surface of the cathode 305, the Lorentz force is directed substantially along a direction substantially perpendicular to the z-direction and radially compresses the plasma 320 over a small distance along the z-direction. In this configuration, only a single micropinch or EUV hot spot may develop along the z-direction. Outside the area or region 370, the strong curvature of the current lines causes additional expansion of the plasma along the axial direction, thus decreasing the number of particles in the pre-compressed plasma column.

In an embodiment of the invention, a strong gradient of initial plasma parameters may be obtained by positioning the anode 310 proximate the cathode 305 such that the distance L separating the cathode 305 and the anode 310 along the x direction (i.e., the direction substantially perpendicular to the discharge axis or z-direction) is greater, and preferably, substantially greater, than the distance l separating the cathode 305 and the anode 310 along the z-direction. Thus, the following condition should be met: L>>l. In an embodiment, the distance L is at least 50% greater than the distance l. In another embodiment, L=2*l.

The distance between the anode and the cathode may be determined and adjusted based upon the desired axial size of the pinch or plasma column. In an embodiment, the distance between the anode 310 and the cathode 305 may be pre-set and fixed during assembly of the source 300 such that the etendue of the source SO matches the etendue of the lithographic apparatus. This distance may be determined based on calibration, as will be appreciated by one of ordinary skill in the art.

Alternatively, the anode 310 and the cathode 305 may be moved relative to each other, for example, along the discharge axis (z-direction), in order to adjust the axial size of the pinch. For example, in an embodiment, the anode 310 may be connected to a driving unit constructed and arranged to displace the anode, for example, along the axial direction. The driving unit may be in communication with a controller to adjust the position of the anode. The controller may be operatively connected to a monitoring unit (e.g., a camera) configured to monitor the plasma pinch during the discharge. For example, the monitoring unit may determine that the initial cathode-anode configuration produces a plasma pinch having one or more EUV radiating points. Based on the results of the monitoring unit, the controller may be configured to control the driving unit to adjust the position (e.g., axial position) of the cathode relative to the anode so as to decrease or increase the number of EUV radiating points or hot spots and, thus, adjust the etendue of the source 300.

Figure 6:
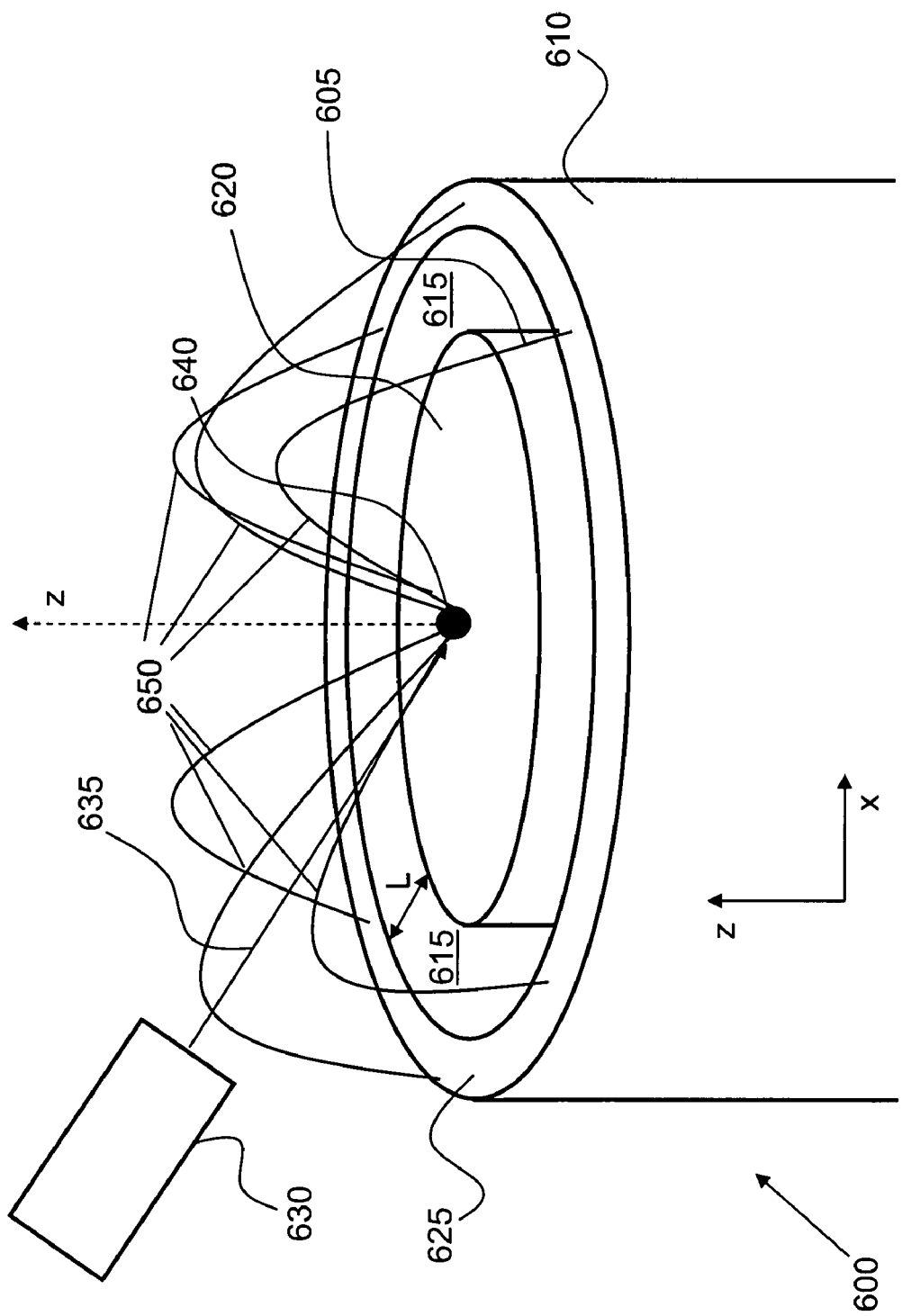
FIG. 6 schematically represents an EUV plasma source in accordance with an embodiment of the invention.

Referring now to FIG. 6, this figure shows a plasma source 600 in accordance with an embodiment of the invention. The plasma source 600 includes a cathode 605, an anode 610 and a discharge space 615 located between the anode and the cathode. The cathode 605 and anode 610 have a substantially cylindrical shape and are rotationally symmetric with respect to the discharge axis or z-axis. The anode 610 is positioned relative to the cathode such that the upper surface 620 of the cathode and the upper surface 625 of the anode are substantially co-planar. This electrode configuration may be referred to as an open type electrode geometry, in which l≈0.

The plasma source 600 may further include a laser source 630 to ignite the plasma. In such a configuration, a layer of tin (Sn) may be arranged on the upper surface 620 of the cathode 605. As noted in the embodiment of the FIGS. 3a-b, the radiation beam 635 outputted by the laser source 630 is focused onto the upper surface 620 of the cathode 605. Due to the absorption of the laser energy, Sn is evaporated and partly ionized.

In operation, a high voltage is applied between the cathode 605 and the anode 610. The electrons and ions created by ionization of the fuel (e.g. Sn) initiate a breakthrough between the cathode 605 and the anode 610, which, in turn, generates a plasma 640. Because of the high currents generated between the cathode 605 and anode 610, and the concentration of the current lines 650 at the cathode 605, the plasma 640 pinches at or near the upper surface 620 of the cathode 605.

In the embodiment of FIG. 6, the upper surface 620 of the cathode and the upper surface 625 of the anode are substantially in a same plane, e.g. co-planar. As discussed in the embodiment of FIG. 5, it will be appreciated that expansion of the pinch along the discharge axis (axial direction or z-axis) may still be reduced when the upper surfaces 620, 625 are separated by a small distance along the z-axis.

While the EUV sources in FIGS. 3a-6 have been illustrated using an electrode system with full axial symmetry, it will be appreciated that regulation of the EUV radiating plasma axial size can also be performed with an electrode system having no axial symmetry. Due to the rotational symmetry of the initial plasma evaporated by the radiation beam, the positional stability of the plasma pinch may be substantially improved even in a system without rotational symmetry, for example similar to the one schematically shown in FIG. 7.

Figure 7:
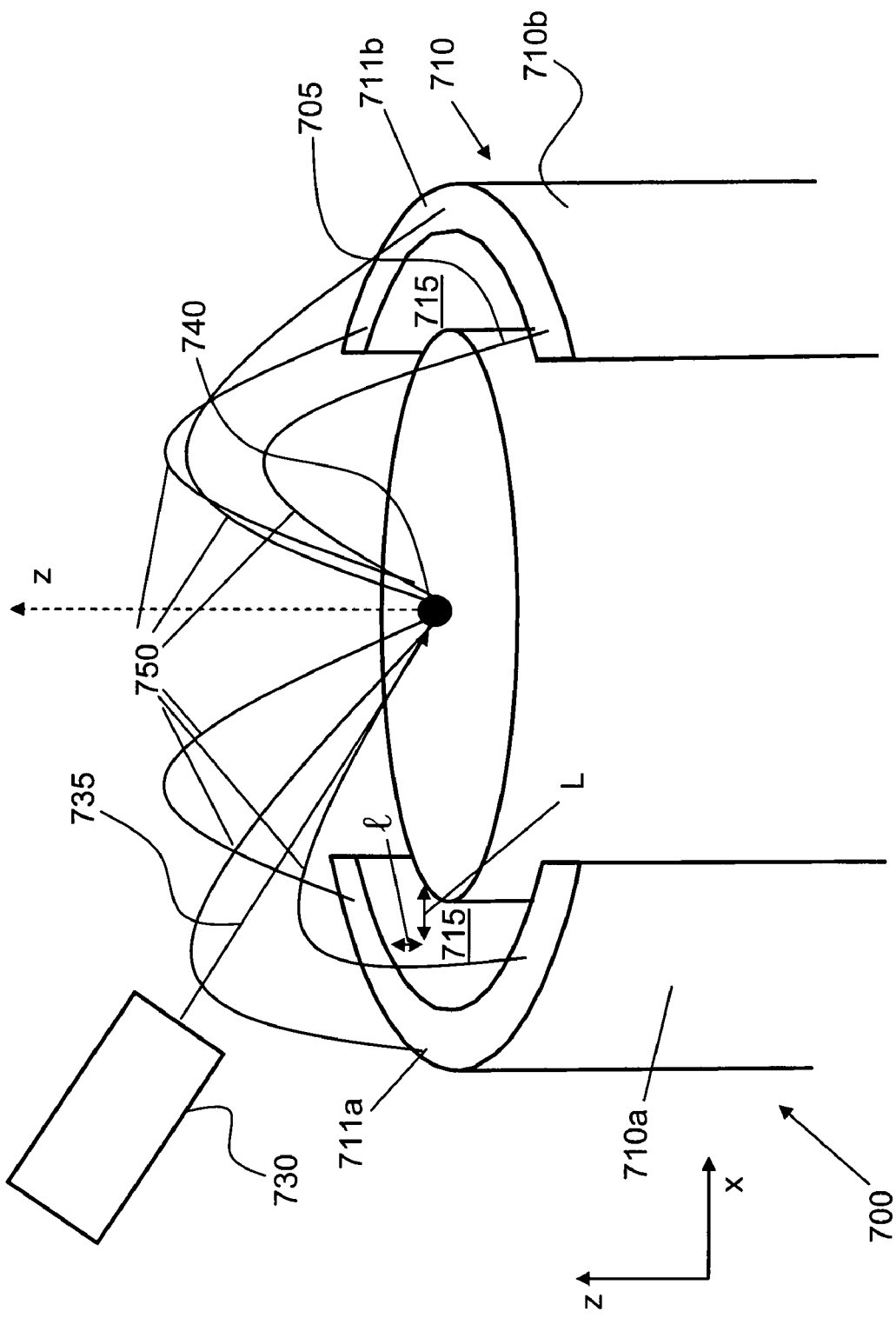
FIG. 7 schematically represents an EUV plasma source in accordance with an embodiment of the invention.

FIG. 7 shows a plasma source 700 in accordance with an embodiment of the invention. The plasma source 700 includes a cathode 705, an anode 710 and a discharge space 715 located between the anode and the cathode. The anode 710 includes a first part 710a and a second part 710b positioned proximate the cathode 705. The first and second parts 710a-b of the anode 710 have a substantially curved shape that envelope a portion of the cathode 705. The first and second parts 710a-b may be positioned substantially at a same distance from the cathode 705, as in FIG. 7. However, it will be appreciated that the distance between the cathode 705 and the first part 710a and the distance between the cathode 705 and second part 710b may be different in an embodiment of the invention.

In FIG. 7, the first and second parts 710a-b are positioned relative to the cathode 705 such that the distance l between the upper surfaces 711a-b of the anode 710 and the cathode 705 along the z-direction is smaller, preferably substantially smaller, than the distance(s) L separating the cathode 705 and the cathode 710 in the x-y plane. The distance l may be positive or negative, i.e., the upper surfaces 711a-b of the anode 710 may be above or below the upper surface of the cathode 705.

Similarly to FIG. 6, the plasma source 700 may include a laser source 730 to ignite the plasma 740. In such a configuration, a layer of tin (Sn) may be arranged on the upper surface of the cathode. As noted in the embodiment of the FIGS. 3a-b, the radiation beam 735 outputted by the laser source 730 is focused onto the upper surface of the cathode 705. Due to the absorption of the laser energy, Sn is evaporated and partly ionized. FIG. 7 shows the concentration of the current lines 750 at the cathode 705.

Figure 8:
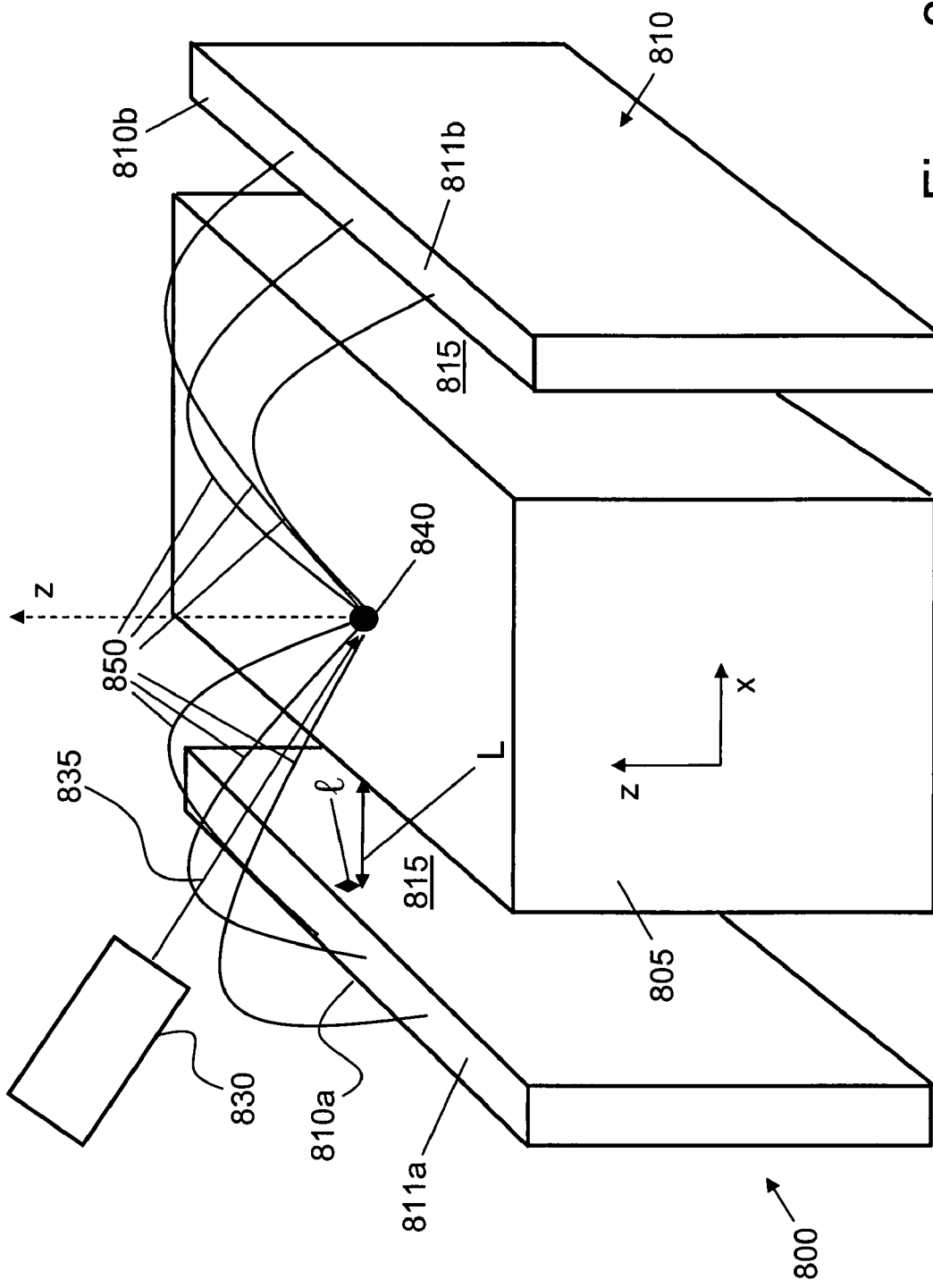
FIG. 8 schematically represents an EUV plasma source in accordance with an embodiment of the invention.

FIG. 8 shows a plasma source 800 in accordance with an embodiment of the invention. The plasma source 800 includes a cathode 805, an anode 810 and a discharge space 815 located between the anode and the cathode. The anode 810 includes a first plate 810a and a second plate 810b positioned proximate the cathode 805. The first and second plates 810a-b are substantially parallel to the cathode 805 and positioned at substantially the same distance L from the cathode 805. It will be appreciated that the distance between the cathode 805 and the first part 810a and the distance between the cathode 805 and second part 810b may be different in another embodiment of the invention.

As in FIG. 7, the first and second plates 810a-b are positioned relative to the cathode 805 such that the distance t between the upper surfaces 811a-b of the anode 810 and the cathode 805 along the z-direction is smaller, desirably substantially smaller, than the distance(s) L separating the cathode 805 and the anode 810 in the x-y plane. The distance l may be positive or negative, i.e., the upper surfaces 811a-b of the anode 810 may be above or below the upper surface of the cathode 805.

Furthermore, similarly to FIG. 6, the plasma source 800 may include a laser source 830 to ignite the plasma 840. In such a configuration, a layer of tin (Sn) may be arranged on the upper surface of the cathode. As noted in the embodiment of the FIGS. 3a-b, the radiation beam 835 outputted by the laser source 830 is focused onto the upper surface of the cathode 805. Due to the absorption of the laser energy, Sn is evaporated and partly ionized. FIG. 8 shows the concentration of the current lines 850 at the cathode 805.

It will be appreciated that the systems shown in FIG. 6-8 may be modified in other embodiments of the invention. In addition, in view of the fact that the anode in FIGS. 5-8 does not block the radiation emitted by the plasma pinch, it is possible to substantially increase the collectable angle of EUV radiation.

A strong gradient of initial plasma parameters may also or alternatively be produced in an embodiment of the invention by controlling the ablation of the working material onto the surface of the cathode with the radiation beam. Expansion of the initial plasma and the fuel vapor generated by interaction between the radiation beam and the working material (fuel) on the cathode may depend upon the focus conditions of the radiation beam and the spot size of the radiation beam on the cathode.

Figure 9:
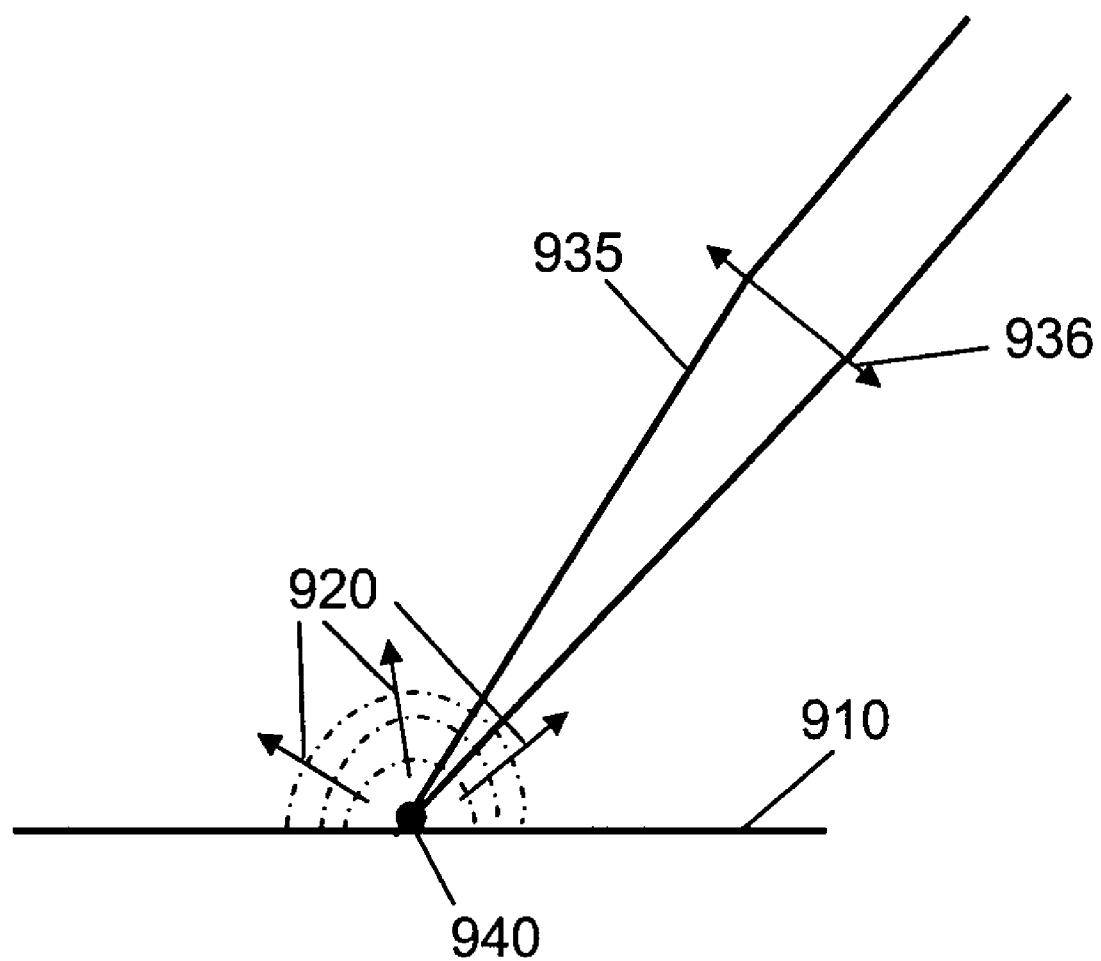
FIG. 9 schematically represents the ablation of the fuel material with a radiation beam in accordance with an embodiment of the invention.

For example, referring to FIG. 9, the upper surface of the cathode 910 may be positioned substantially in the focal plane of the optical system 936 that directs the radiation beam 935 onto the upper surface of the cathode. In this embodiment, the radial spot of the radiation beam on the upper surface of the cathode is substantially reduced. This configuration creates an initial plasma 940 that expands substantially isotropically, as schematically shown in FIG. 9. The expansion of the vapor of ionized gas due to laser ablation is schematically represented by arrows 920 in FIG. 9. It will be appreciated that the density of particles along the z-axis in the initial plasma 940 is smaller than the density of particles in an anisotropic plasma that expands substantially along the z-axis. As a result, compression of the plasma in the embodiment of FIG. 9, and thus formation of a micropinch, may only occur in an area proximate the surface of the cathode 910. In an embodiment, the size (e.g. diameter) of the spot of the radiation beam 935 is smaller than about 50 μm. In an embodiment, the size of the spot is selected from the range between about 30 μm and 50 μm.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not to scale. The present invention is not limited to those elements, shown in the schematic drawings (e.g. the number of mirrors drawn in the schematic drawings). Further, the present invention is not confined to the lithographic apparatus described in relation to FIGS. 1 and 2.

What is claimed is:

1. A source configured to generate radiation for a lithographic apparatus, the source comprising:
   an anode having an upper surface; and
   a cathode having an upper surface with a layer of a specific material provided thereon such that the source is configured to vaporize the specific material to generate a plasma which emits the radiation having a wavelength in the extreme ultraviolet range of the electromagnetic spectrum, the cathode and the anode configured to create a discharge in a fuel in a discharge space between the anode and the cathode so as to generate the plasma, the cathode and the anode positioned relative to each other so that, in use, current lines extending between the anode and the cathode are substantially curved so as to create a force that substantially radially compresses the plasma only in a region proximate the upper surface of the cathode or of the anode.

2. The source of claim 1, wherein the force substantially causes expansion of the plasma along a direction substantially perpendicular to the upper surface and outside the region proximate the upper surface.

3. The source of claim 1, wherein a distance L separating the cathode and the anode along a direction substantially parallel to the upper surface is larger than a distance l separating the cathode and the anode along a direction substantially perpendicular to the upper surface.

4. The source of claim 3, wherein $L \geq 2*l$.

5. The source of claim 1, wherein the upper surface of the anode is substantially co-planar with the upper surface of the cathode.

6. The source of claim 1, wherein the cathode and the anode are rotationally symmetric.

7. The source of claim 1, further comprising:
a laser source to output a radiation beam being focused on the upper surface of the cathode to ignite a plasma discharge.

8. The source of claim 1, wherein the fuel includes at least one of Sn or Li.

9. The source of claim 1, wherein an etendue of the, source substantially matches an etendue of the lithographic apparatus.

10. The source of claim 1, wherein the etendue of the source is less than about 0.03 $mm^2$ steradian.

11. The source of claim 1, wherein the cathode or the anode includes a first part and a second part and wherein the other of the cathode or anode is positioned between the first part and the second part.

12. The source of claim 1, wherein the cathode and anode have a cylindrical shape that is substantially centered on a common axis.

13. The source of claim 1, further comprising a radiation source configured to output a radiation beam and an optical system configured to direct the radiation beam on the upper surface, wherein the upper surface is positioned substantially in a focal plane of the optical system.

14. The source of claim 13, wherein a spot size of the radiation beam on the upper surface is in a range between about 30 μm and 50 μm.

15. The source of claim 1, wherein the compression of the plasma in the region proximate the upper surface produces a single radiation emission spot during the discharge.

16. The source of claim 1, wherein the cathode and the anode are positioned relative to each other such that the anode does not block the radiation emitted by a plasma pinch.

17. A lithographic system comprising:
a source configured to generate radiation for a lithographic apparatus, the source including
an anode having an upper surface, and
a cathode having an upper surface with a layer of a specific material provided thereon such that the source is configured to vaporize the specific material to generate a plasma which emits the radiation having a wavelength in the extreme ultraviolet range of the electromagnetic spectrum, the cathode and the anode configured to create a discharge in a fuel in a discharge space between the anode and the cathode so as to generate the plasma, the cathode and the anode positioned relative to each other so that, in use, current lines extending between the anode and the cathode are substantially curved so as to create a force that substantially radially compresses the plasma only in a region proximate the upper surface of the cathode or of the anode;
a pattern support configured to hold a patterning device, the patterning device configured to pattern the radiation to form a patterned beam of radiation;
a substrate support configured to support a substrate; and
a projection system configured to project the patterned beam of radiation onto the substrate.

18. The apparatus of claim 17, wherein the force substantially causes expansion of the plasma along a direction substantially perpendicular to the upper surface and outside the region proximate the upper surface.

19. The apparatus of claim 17, wherein a distance L separating the cathode and the anode along a direction substantially parallel to the upper surface is larger than a distance l separating the cathode and the anode along a direction substantially perpendicular to the upper surface.

20. The apparatus of claim 19, wherein $L \geq 2*l$.

21. The apparatus of claim 17, wherein the upper surface of the anode is substantially co-planar with the upper surface of the cathode.

22. The apparatus of claim 17, wherein the compression of the plasma in the region proximate the upper surface produces a single radiation emission spot during the discharge.

23. The apparatus of claim 17, further comprising:
a laser source to output a radiation beam being focused on the upper surface of the cathode to ignite a plasma discharge.

24. The apparatus of claim 17, wherein the fuel includes at least one of Sn or Li.

25. The apparatus of claim 17, wherein an etendue of the source substantially matches an etendue of the lithographic apparatus.

26. The apparatus of claim 17, wherein the cathode and the anode are positioned relative to each other such that the anode does not block the radiation emitted by a plasma pinch.

27. A method for generating radiation for use in a lithographic apparatus, the method comprising:
supplying a fuel to a discharge space located between a cathode and an anode, wherein the anode having an upper surface and the cathode having an upper surface with a layer of a specific material provided thereon such that the source is configured to vaporize the specific material to generate a plasma which emits the radiation having a wavelength in the extreme ultraviolet range of the electromagnetic spectrum;
creating a discharge between the cathode and the anode in the fuel to form the plasma that is adapted to emit the radiation; and
positioning the cathode and the anode relative to each other so that, in use, current lines extending between the anode and the cathode are substantially curved so as to create a force that substantially radially compresses the plasma only in a region proximate the upper surface of the cathode or of the anode.

28. The method of claim 27, wherein the force substantially causes expansion of the plasma along a direction substantially perpendicular to the upper surface and outside the region proximate the upper surface.

29. The method of claim 27, wherein a distance L separating the cathode and the anode along a direction substantially parallel to the upper surface is larger than a distance l separating the cathode and the anode along a direction perpendicular to the upper surface.

30. The method of claim 29, wherein $L \geq 2*l$.

31. The method of claim 27, wherein the upper surface of the anode is substantially co-planar with the upper surface of the cathode.

32. The method of claim 27, wherein compression of the plasma in the region proximate the upper surface produces a single radiation emission spot during the discharge.

33. The method of claim 27, further comprising:
a laser source to output a radiation beam being focused on the upper surface of the cathode to ignite a plasma discharge.

34. The method of claim 27, wherein the fuel includes at least one of Sn or Li.

35. The method of claim 27, wherein the positioning includes positioning the cathode and the anode relative to each other such that an etendue of a source configured to generate the plasma substantially matches an etendue of the lithographic apparatus.

36. A device manufacturing method comprising:
generating a beam of radiation, the generating including
supplying a fuel to a discharge space located between a cathode and an anode of a source, wherein the anode having an upper surface and the cathode having an upper surface with a layer of a specific material provided thereon such that the source is configured to vaporize the specific material to generate a plasma which emits the radiation having a wavelength in the extreme ultraviolet range of the electromagnetic spectrum,
creating a discharge between the cathode and the anode in the fuel to form the plasma that is adapted to emit the radiation, and
positioning the cathode and the anode relative to each other so that, in use, current lines extending between the anode and the cathode are substantially curved so as to create a force that substantially radially compresses the plasma only in a region proximate the upper surface of the anode or of the cathode;
patterning the beam of radiation to form a patterned beam of radiation; and
projecting the patterned beam of radiation onto a substrate.

* * * * *